US006252277B1

(12) United States Patent
Chan et al.

(10) Patent No.: US 6,252,277 B1
(45) Date of Patent: Jun. 26, 2001

(54) EMBEDDED POLYSILICON GATE MOSFET

(75) Inventors: Lap Chan, San Francisco, CA (US); Cher Liang Cha, Singapore (SG); Eng Fong Chor, Singapore (SG); Gong Hao, Singapore (SG); Teck Koon Lee, Singapore (SG)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 0 days.

(21) Appl. No.: 09/392,392

(22) Filed: Sep. 9, 1999

(51) Int. Cl.[7] .................................................. H01L 29/72
(52) U.S. Cl. .......................... 257/330; 257/332; 438/270; 438/276; 438/300
(58) Field of Search ..................................... 257/330, 332; 438/270, 276, 300

(56) References Cited

U.S. PATENT DOCUMENTS

| 5,576,227 | 11/1996 | Hsu | 437/35 |
| 5,665,619 | 9/1997 | Kwan et al. | 438/270 |
| 5,770,514 | 6/1998 | Matsuda et al. | 438/589 |
| 6,172,398 | * 1/2001 | Hshieh | 257/330 |

* cited by examiner

*Primary Examiner*—Edward Wojciechowicz
(74) *Attorney, Agent, or Firm*—George O. Saile; Rosemary L. S. Pike (57) ABSTRACT

Formation of a MOSFET with a polysilicon gate electrode embedded within a silicon trench is described. The MOSFET retains all the features of conventional MOSFETs with photolithographically patterned polysilicon gate electrodes, including robust LDD (lightly doped drain) regions formed in along the walls of the trench. Because the gate dielectric is never exposed to plasma etching or aqueous chemical etching, gate dielectric films of under 100 Angstroms may be formed without defects. The problems of over etching, and substrate spiking which are encountered in the manufacture of photolithographically patterned polysilicon gate electrodes do not occur. The entire process utilizes only two photolithographic steps. The first step defines the silicon active area by patterning a field isolation and the second defines a trench within the active area wherein the device is formed. The new process, uses the same total number of photolithographic steps to form the MOSFET device elements as a conventional process but is far more protective of the thin gate oxide.

28 Claims, 13 Drawing Sheets

EMBEDDED POLYSILICON GATE MOSFET

BACKGROUND OF THE INVENTION (1) Field of the Invention

The invention relates to processes for the manufacture of semiconductor devices and more particularly to processes to the formation of polysilicon gate MOSFETs.

(2) Background of the Invention and Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. Most of the ICs produced today utilize the MOSFET (metal oxide silicon field effect transistor) as the basic semiconductive device. MOSFETs are chosen over their bipolar counterparts because they can be easily manufactured and, because they operate at low voltages and currents, they generate less heat thereby making them well suited for high density circuit designs.

Figure 1:
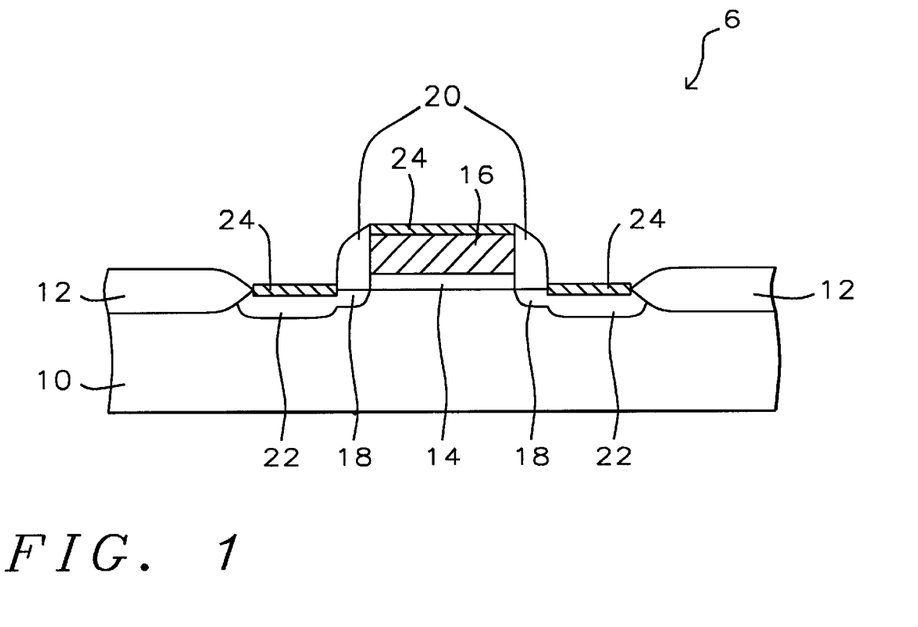
FIG. 1 is a cross sectional view of a conventional polysilicon gate MOSFET with LDD regions.

The most widely used MOSFET device is the self-aligned polysilicon gate MOSFET which is shown in cross section in FIG. 1. The device 6 is constructed on a monocrystalline silicon wafer 10. A field oxide isolation 12 surrounds an island of active silicon whereupon the device is formed. The main elements of the device are the gate oxide 14, the source/drain regions 22, and the gate electrode 16. Generally, LDD (lightly doped drain) regions 18 are formed through the use of insulative sidewalls 20 to moderate the p/n junctions at the ends of the channel region which develops during operation directly below the gate oxide 14. transition metal silicide regions 24 are formed over the polysilicon gate electrode 16 and source/drain regions 22 to lower the resistivity of the polysilicon gate electrode 16 and subsequently formed source/drain contacts. The LDD 18 and source/drain 22 regions are formed by ion implantation and are self-aligned to the gate electrode. Variations of the MOSFET design are prevalent.

The structure shown in FIG. 1 shows the basic elements of the MOSFET. Often the gate electrode is more complex, consisting of a multilayered structure having a doped polysilicon layer over an undoped layer. In addition a silicide layer is deposited onto the doped layer. When self-aligned source/drain contacts are formed, an additional insulative layer is added over the conductive layers which form the gate electrode. The various layers which form the gate electrode are successively blanket deposited on silicon wafer and then patterned with a photolithographic mask such as photoresist or a hardmask.

As device geometries shrink to achieve higher and higher circuit densities, the thickness of the gate oxide has become extraordinarily thin. In current technologies, gate oxide of less than 100 Å are commonplace and oxide thicknesses of the order of 30 Å are contemplated. This presents a considerable concern in etching the gate electrode stack because the oxide is relied upon to act as an etch stop, preventing attack of the subjacent silicon active regions. The development of improved etching tools such as HDP (high density plasma) ietchers together with improved etchant chemistries have resulted in the achievement of high polysilicon-to-oxide etching selectivities which have, to a degree, permitted the use of thinner gate oxides. However, these improvements are approaching a limitation. Problems of penetration of oxide weak spots are increasingly more prevalent.

Figure 2:
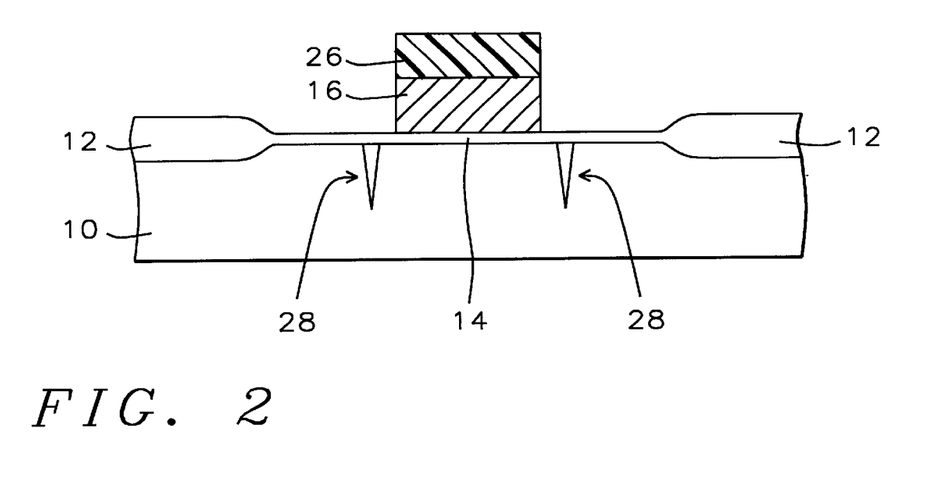
FIG. 2 is a cross sectional view of a conventional polysilicon gate MOSFET showing spiking in the subjacent silicon after gate patterning.

This problem is illustrated in the cross section of FIG. 2 wherein the gate stack 16 has been etched to the thin oxide 14 using a photoresist mask 26. Weak or thin spots in the oxide 14 are penetrated by the silicon etch resulting in deep spikes 28 in the subjacent monocrystalline silicon 10. It is expected that the severity of these spiking problems will rapidly increase as gate oxide thicknesses are further reduced. It is apparent that it would be desirable adopt a MOSFET design which would to avoid these problems without sacrificing the desirable operational features of the present structure. The current invention, by using a gate electrode embedded in a trench, provides a MOSFET design for achieving this goal and a method for forming the same.

Other references have described MOSFET designs using trench embedded polysilicon gate structures. Hsu, U.S. Pat. No. 5,576,227 shows a structure wherein a MOSFET gate and gate electrode are formed in a shallow trench wherein the gate oxide and the gate electrode are defined by two back-to-back spacers on of which extends into the trench. The spacer pair provides a robust insulative separator between the gate electrode and the source/drain regions. However, the structure lacks LDD regions. Kwan, et.al., U.S. Pat. No. 5,665,619 shows a DMOS transistor (double diffused MOSFET) formed in a deep trench. A DMOS transistor is a high power device in which current is supplied by two sources through two separate gates to a common drain. The sources and their respective channel regions are located along opposing vertical sides of a trench with the common gate electrode in between and the drain beneath. Matsuda, et.al., U.S. Pat. No. 5,770,514 also shows a vertical channel double diffused FET formed on the sidewalls of a trench.

SUMMARY OF THE INVENTION

It is an object of this invention to describe an embedded polysilicon gate MOSFET with LDD regions.

It is another object of this invention to provide a method for forming an embedded polysilicon gate MOSFET with LDD regions.

It is yet another object of this invention to describe a method for forming a MOSFET with a gate thickness below 100 Angstroms.

It is still another object of this invention to provide a method for forming a thin polysilicon gate MOSFET without subjecting gate oxide surfaces to a plasma during gate electrode formation.

It is another object of this invention to provide a method for forming a thin gate MOSFET wherein the gate oxide surface is not subjected to chemical etchants prior to gate deposition.

These objects are accomplished by forming an polysilicon gate MOSFET wherein the device is formed in a rectangular trench. An opening is formed in a doped oxide and silicon nitride spacer is formed along the periphery of the opening. The spacer separates the source/drain regions of the MOSFET from the gate electrode which is formed over a thin oxide gate dielectric on the walls and base of the trench. After the spacer is formed, the trench is etched. A sacrificial oxide layer is next deposited and polished and etched beck to form an oxide plug in the trench. The upper surface of the oxide plug extends above the plane of the silicon surface while the faster etching doped oxide is completely cleared over the silicon.

Epitaxial regions doped with an impurity of opposite type from the substrate, are then grown on the planar silicon surface, adjacent to the spacer to form the source/drain regions. The oxide plug abuts the spacers and prevents epitaxial deposition within the trench. The sacrificial oxide plug is then etched further down into the trench and ions of the same impurity type as the epitaxial layer are implanted by LATI (large angle tilt ion implantation) to form LDD regions along opposing walls of the trench. The sacrificial oxide is removed and a gate oxide is grown.

A polysilicon layer is then deposited, patterned, and etched back to leave the gate electrode within the trench. Forming the source/drain elements by epitaxial growth in the manner taught by the invention, results in self-alignment of the source/drain elements, along with the LDD regions, to the channel region of the MOSFET, thereby reducing dependence on photolithography. The silicon surfaces of the source/drain regions and the polysilicon gate electrode are selectively provided with a silicide coating. The spacer is optionally removed and an ILD (interlevel dielectric) layer is deposited through which contacts to the device elements are formed.

In a second embodiment, a method similar the that of the first embodiment is used to form an embedded polysilicon gate MOSFET with ion implanted source/drain regions. In this application the initial trench defining insulative layer is not required to be faster etching than the sacrificial oxide.

DESCRIPTION OF THE PREFERRED EMBODIMENTS

Figure 3:
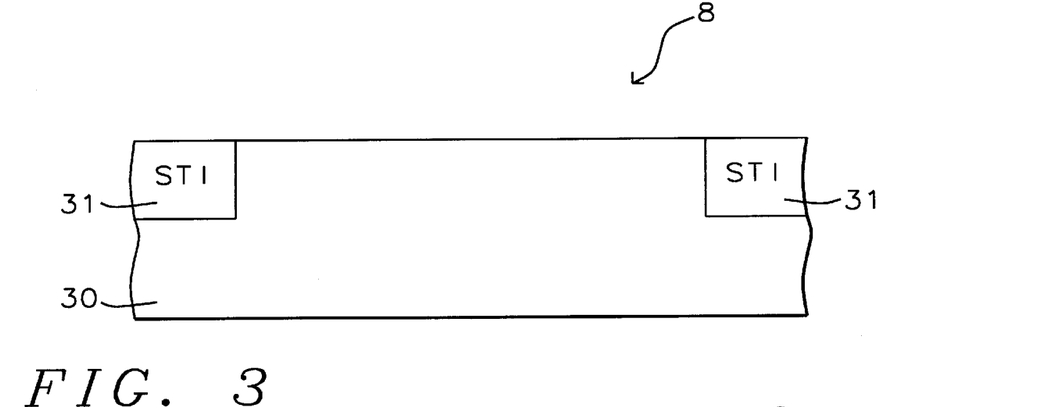
FIG. 3 is a cross sectional view of a wafer showing a shallow trench field isolation (STI) region wherein an embedded polysilicon gate MOSFET is to be formed according to the methods of this invention.

In a first embodiment of this invention a p-channel MOSFET with an embedded polysilicon gate and self-aligned LDD regions is formed. Referring first to FIG. 3, a p-type <100> oriented monocrystalline silicon wafer 30 with a resistivity of between about 2 and 50 ohm cm. is provided. A field isolation 31 preferably shallow trench isolation (STI) is formed defining an enclosed silicon region 8 wherein the device will be formed. The STI region 31 is formed by the well known method of anisotropically etching a trench surrounding the active silicon device region, growing a between about 100 and 500 Angstrom thick thermal oxide in the trench and then filling the trench by depositing an insulative layer, preferably silicon oxide.

The excess silicon oxide above the trench is then removed by CMP (chemical mechanical polishing). Alternately the field isolation 31 may be formed by the familiar LOCOS (local oxidation of silicon) method. The field isolation is between about 0.2 and 0.4 microns thick. In order to more clearly delineate the structural features of the embedded gate MOSFET, the STI region will be omitted in the next set of figures (FIGS. 4A through 4K) which illustrate the various process steps. Only the region 8 containing the device elements in the device active area are shown, that is, the STI regions 31 are omitted in the drawings.

Figure 4A:
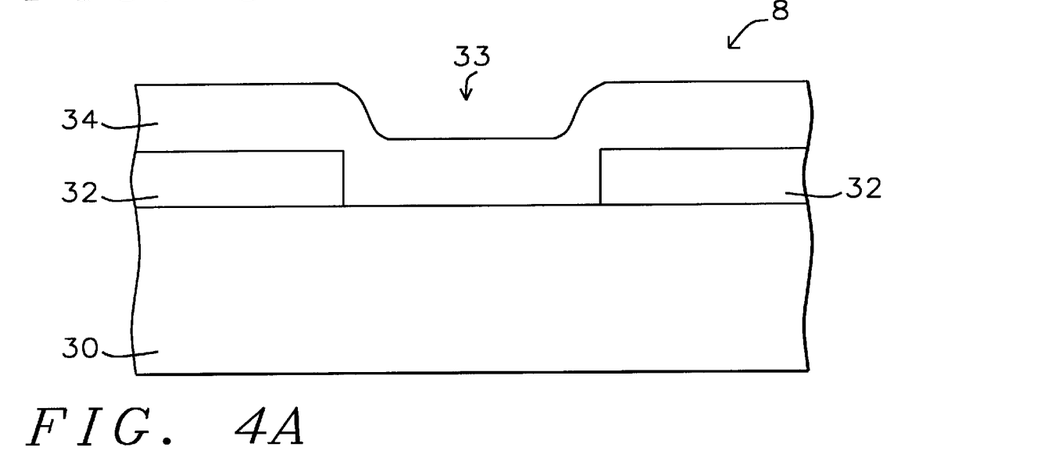
FIG. 4A through FIG. 4K are cross sections illustrating the process steps used in a first embodiment of this invention.
Figure 4B:
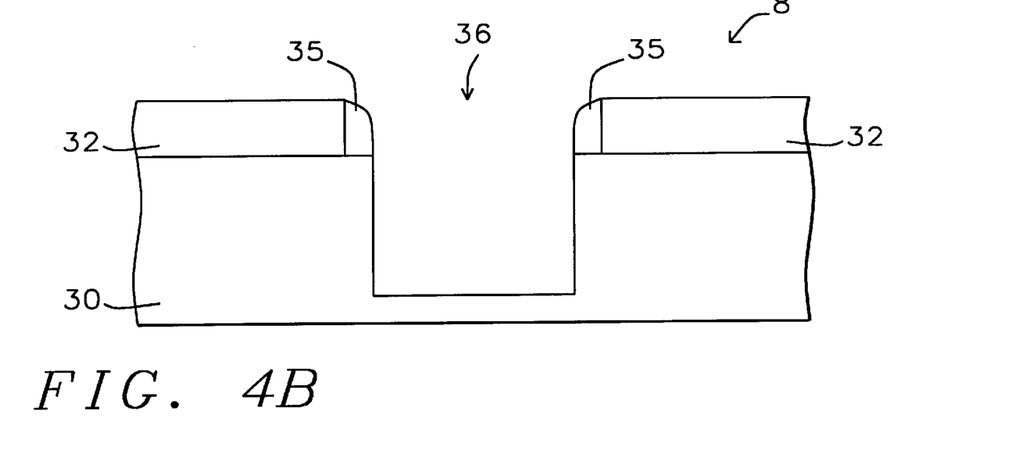

Referring to FIG. 4A, an doped oxide layer 32, for example BPSG (borophosphosilicate glass) or PSG (phosphosilicate glass) is deposited on the wafer 30 by a conventional conformal deposition process such as LPCVD (low pressure chemical vapor deposition). Alternately, an undoped silicon oxide may be used to form the layer 32 but it is not recommended for reasons which will become clear later. A doped layer is preferred because it has a higher wet etch rate than undoped silicon oxide. The benefit of this higher etch rate will become apparent in a later step. The doped silicon oxide layer 32 is between about 0.2 and 0.3 microns thick. An opening 33 is patterned in the oxide layer by conventional photolithography, and a silicon nitride layer 34 is deposited over the oxide layer 32. The silicon nitride layer 34 is deposited by LPCVD or by PECVD to a thickness of between about 800 and 1,200 Angstroms. Referring next to FIG. 4B, the silicon nitride layer is anisotropically etched to form silicon nitride sidewall spacers 35 along the periphery of the opening 33. The spacers are between about 600 and 1,500 Angstroms wide at their base.

Using the doped oxide layer 32 and the spacers 35 as a mask, a trench 36 is etched in the silicon to a depth of between about 0.1 and 0.3 microns. The trench 36 is anisotropically etched by RIE (reactive ion etching) using well known silicon etchant compositions containing, for example, chlorine or gas mixtures containing $HBr/SF_6/O_2$ or $HBr/Cl_2/O_2$. Silicon trench etching methods have been developed that trenches with smooth vertical walls and flat bottoms can be readily achieved.

Figure 4C:
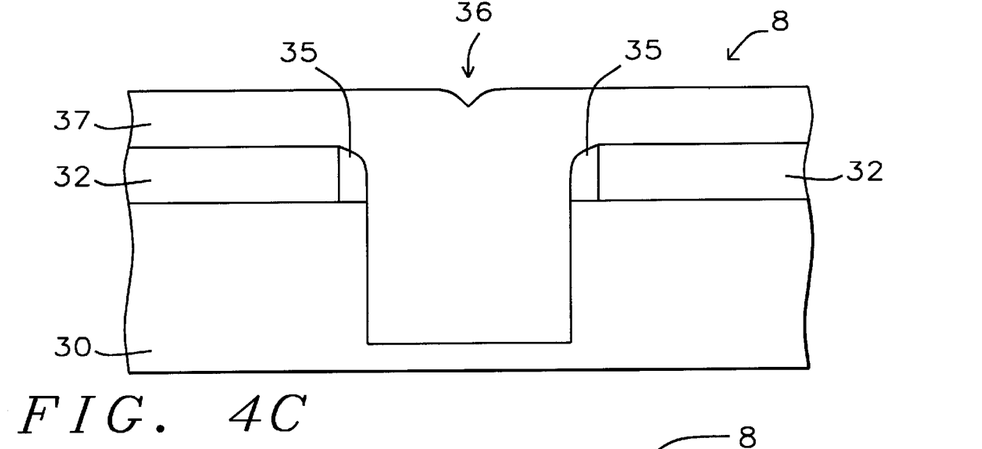

Turning now to FIG. 4C, a layer 37 of undoped silicon oxide, between about 0.4 and 0.7 microns thick, is deposited onto the wafer preferably by HDPECVD (high density plasma enhanced chemical vapor deposition). This thickness is sufficient to completely fill the trench 36 and provide additional material above it. The oxide layer 37 combined with the first doped oxide 32 will be used as a sacrificial layer for masking in two successive process operations. In the first masking operation, an upper portion of the layer 37 is polished away by CMP until the tops of the silicon nitride spacers 35 are just covered by oxide. This makes the surface of the layer 37 uniformly planar and parallel to the silicon surface.

Figure 4D:
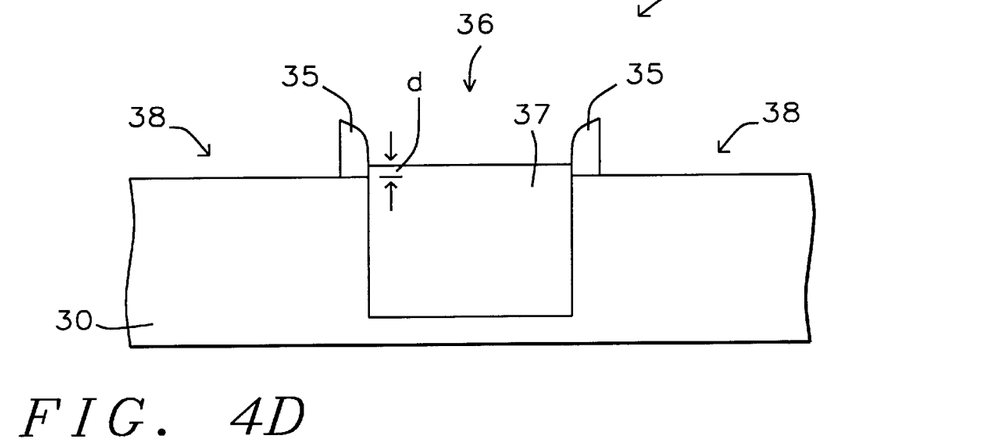

The remaining portion of the oxide layer 37 and the doped oxide layer 32 are next removed with a calibrated dilute aqueous HF etchant until the silicon is exposed. Calibrated dilute HF etchants are commonly used in the industry and are capable of removing oxide layers with a degree of precision. Once the oxide layer 37 is cleared over doped oxide layer 32, the faster etching layer 32 is cleared away from over the planar silicon regions while the surface of the slower etching undoped oxide layer 37 remains well above the level of the silicon walls in the trench 36. By polishing and etching the layer 37 in this manner, and taking advantage of the higher etch rate of the doped oxide layer 32, a process window occurs which permits thorough removal of oxide over the active regions while assuring that the upper silicon portions of the trench 36 sidewalls are not exposed. FIG. 4D. shows the proper profile after the oxide layer 37 is etched and the residual oxide layer 37 in the trench covers the silicon sidewalls. A minimum distance "d" of between about 100 and 400 Angstroms is sufficient to protect the upper portion of the trench from subsequent epitaxial growth. The active silicon surface regions 38 extend between the spacers 35 and the STI regions 11(FIG. 3).

Figure 4E:
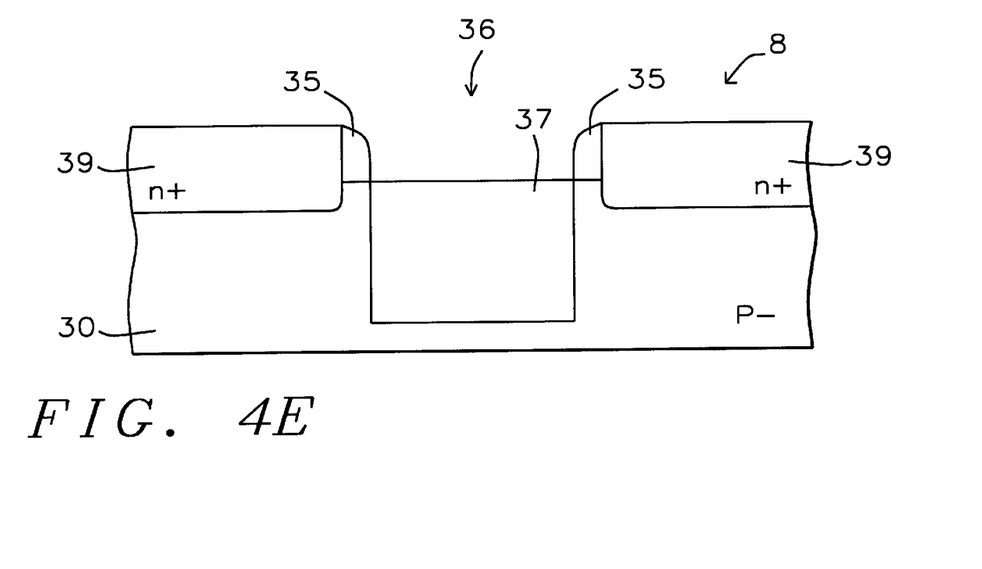

Referring next to FIG. 4E, epitaxial silicon is selectively grown over the exposed silicon regions 38. The epitaxial silicon is in-situ doped with arsenic during growth, forming n-type source/drain elements 39 of the MOSFET. During the epitaxial growth the silicon surface rises along the sidewalls 35 and arsenic doping is driven into the subjacent p-region of the substrate 30. The resultant n+ regions 39 are between about 1,000 and 1,500 Angstroms thick and have a resistivity of between about 50 and 200 ohms per square. During epitaxial growth the n-type regions 39 extend downward into the substrate silicon 30.

Figure 4F:
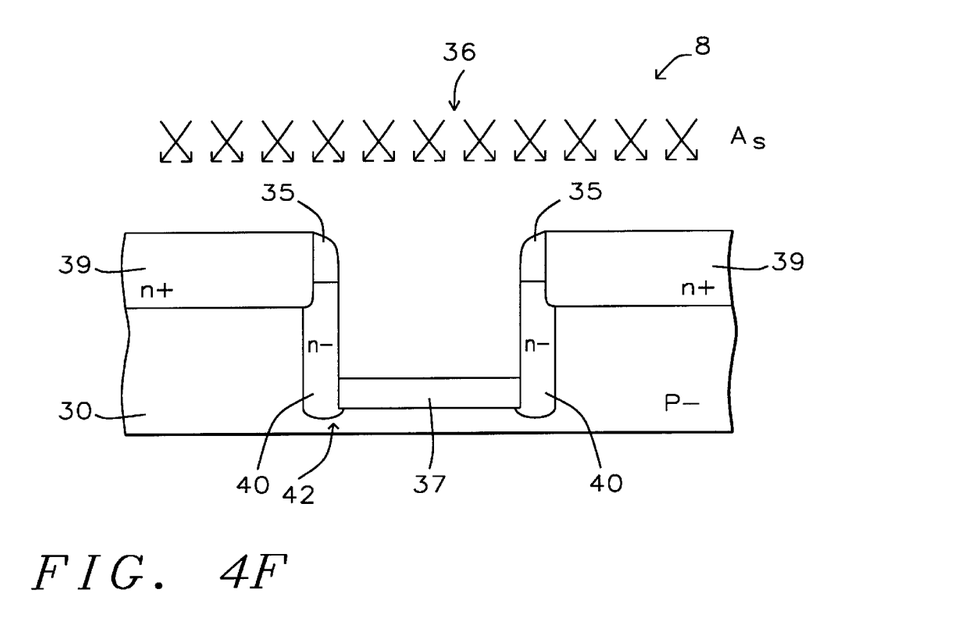

Referring now to FIG. 4F, the pocket of sacrificial silicon oxide layer 37 in the trench 36 is further etched to expose portions of the trench sidewalls. The etching is preferably with a calibrated wet etch such as dilute HF or dilute buffered HF. However, between about 500 and 1,000 Angstroms of the oxide layer 37 is retained over the trench bottom. Arsenic ions are next implanted into the sidewalls of the trench 36. Alternately, another n-type dopant impurity such as phosphorous or antimony may be implanted.

The implantation is performed by LATI whereby the surface of the wafer is tilted at an angle of between about 40 and 50 degrees with respect to the ion beam. The wafer is first oriented so that one sidewall of the trench is implanted at the tilt angle. The wafer is then rotated 180 degrees and the opposite sidewall receives an implantation. The implanted sidewalls of the trench 36 thus become the LDD regions 40 of the MOSFET. The arsenic ions are implanted at a dose of between about $5\times10^{13}$ and $1\times10^{15}$ ions/cm$^2$ at an energy of between about 5 and 15 keV. The LDD regions 40 are self-aligned within the trench 36 and are contiguous with the more heavily doped source/drain regions 39 which have been extended below the level of the spacers 35 during the epitaxial process step. The final 500 to 1,000 Angstroms thick portion of the oxide layer 37 at the base of the trench masks the trench bottom during the LDD ion implant.

It should be noted that the LDD regions 40 extend below and under the bottom corners of the trench 42 so that the corner will not be included in the channel region. This reduces the channel length and places the channel away from stressed regions at the corners. The amount of underpass of the LDD regions is determined by the thickness of the oxide layer 37 remaining on the bottom of the trench. The residual sacrificial silicon oxide 37 within the trench is next removed preferably by a timed wet etch dip in an etch rate calibrated dilute HF solution. Alternately, plasma etching could be used to remove the residual oxide 37. However, this exposes the gate oxide to the plasma. Care must be exercised to avoid thinning the silicon nitride spacers 35.

Figure 4G:
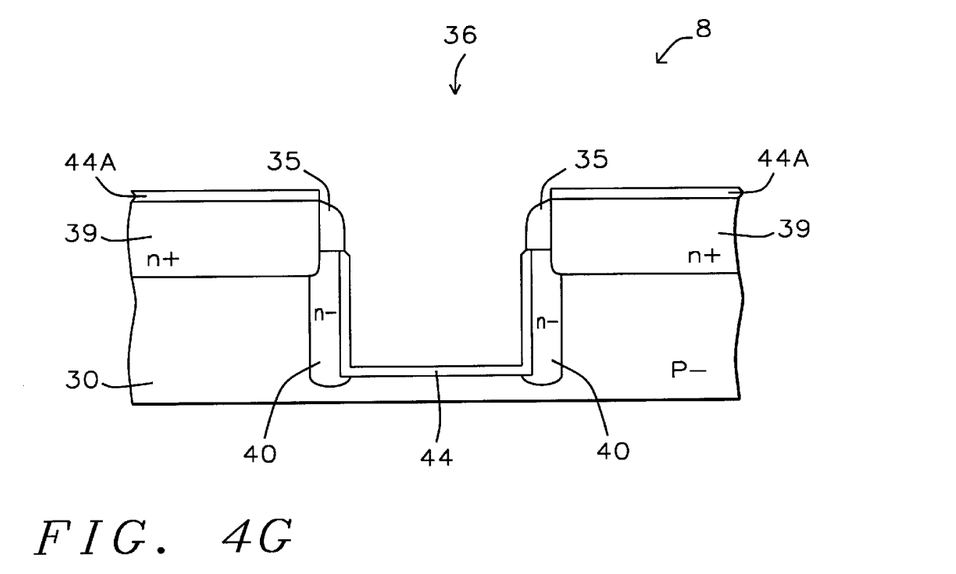
Figure 4H:
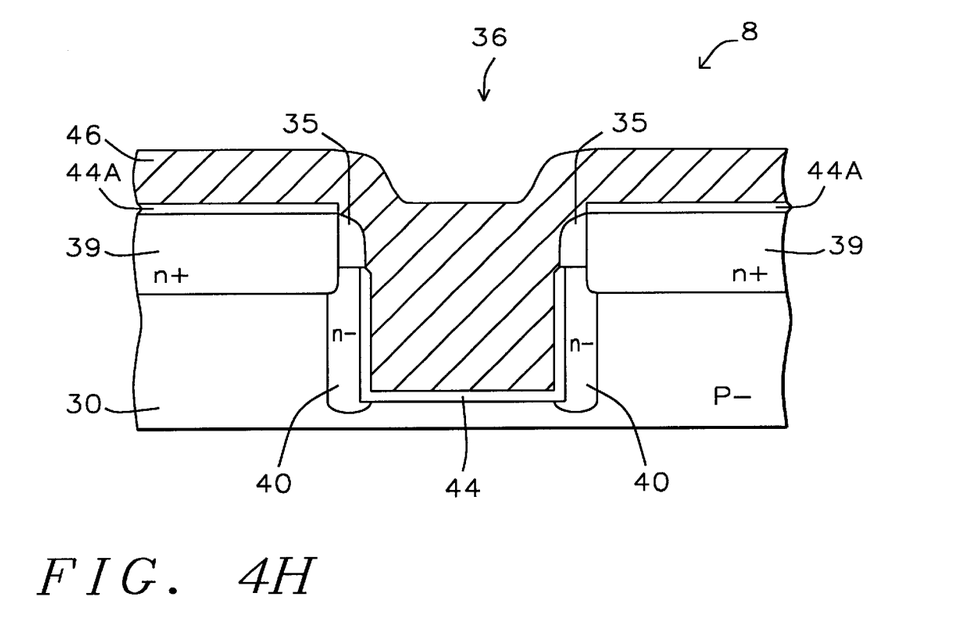

Referring to FIG. 4G a gate oxide is formed on the exposed silicon surface 44 within the trench 36, preferably by thermal oxidation. The gate oxide 44 is between about 30 and 200 Angstroms thick. An oxide 44A is also formed over the source/drain regions 39. Turning next to FIG. 4H, a polysilicon layer 46 is deposited over the wafer 30, filling the trench 36 to above the spacers 35. Preferably, the polysilicon layer 46 is deposited by LPCVD as a laminar structure comprising a portion of undoped polysilicon between about 1,000 and 2,000 Angstroms thick. An arsenic precursor is then added to the deposition gas flow and a second portion of the layer 46 is deposited to achieve a final polysilicon thickness of between about 9,000 and 10,000 Angstroms thick. Alternately the polysilicon layer 46 may be formed in another laminar configuration, or it may by formed from a single polysilicon deposition and subsequently ion implanted with dopant impurities to make it's upper portion more conductive.

Figure 4I:
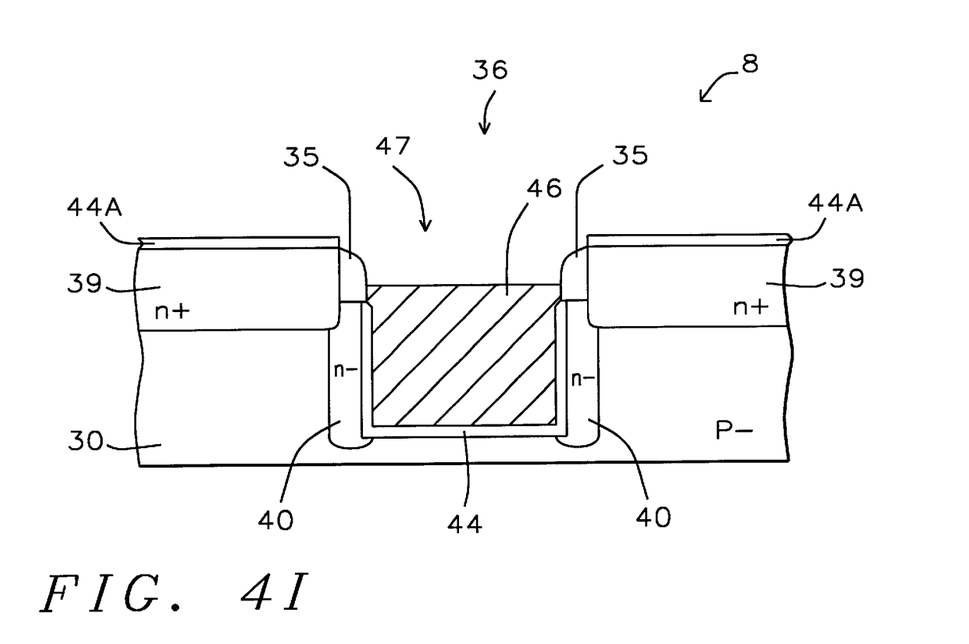

The polysilicon layer 46 is next planarized, preferably by CMP. The polysilicon 46 is then further etched to a depth in the trench 36 so that the polysilicon surface lies between about 1,000 and 2,000 Angstroms above the base of the sidewalls 35 as shown in FIG. 4I. The preferred method is by using a calibrated silicon wet etch, for example aqueous or alcoholic KOH heated to a temperature of between about 180 and 250° C. KOH base etchants provide good etch rate control and a high silicon-to-oxide selectivity. Alternately, an etchant containing TMAH (tetra methyl ammonium oxide) may be used. TMAH etchants are well known and attack silicon at rates of about 100 Å/sec. They have Si:SiO$_2$ selectivities of the order of 1,000:1. The oxide 44A and the sidewalls 35 act as an etch stop, protecting the structures beyond the trench 36. The residual portion 47 of the polysilicon layer 46 within the trench comprises the fully formed gate electrode of the MOSFET. The gate oxide 44 of the device is completely enclosed and will not be exposed to any plasma or chemical etchants. The oxide layer 44A is now removed from over the n-doped source/drain regions 39 by etching with dilute HF.

Figure 4J:
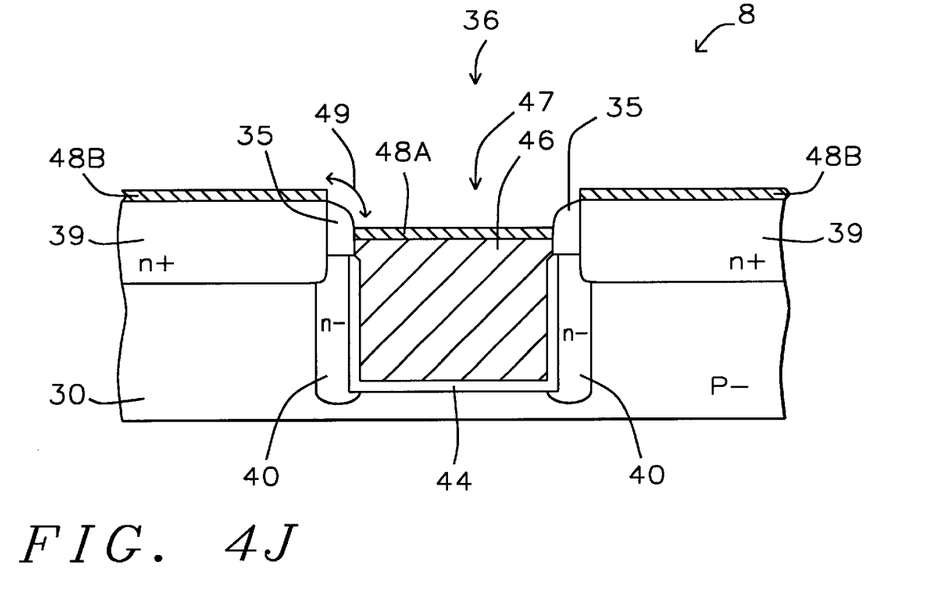

Referring to FIG. 4J, the surfaces of the source/drain regions 39 and the polysilicon gate electrode 47 are selectively silicided to make them more conductive and to prepare them for subsequent contact formation. Procedures for selective silicidation are well known and consist of depositing a blanket layer of a refractory metal for example titanium, cobalt, or nickel, and reacting the metal with the subjacent silicon to form a silicide. Un-reacted metal is then etched away by wet etching leaving a metal silicide 48A over the gate electrode 44 and 48B over the source/drain regions 39. The spacers 35 perform their final role in protecting the subjacent LDD regions 40 and sidewall portions of the gate from silicidation. The surface of the gate 46 must be set deeply enough beneath the tops of the sidewalls 35 to provide a gap 49 between the silicide 48A over the gate electrode and the suicide 48B over the source/drain elements 39.

The silicon nitride spacers 35 are removed, preferably by dipping the wafer 30 into a solution of hot phosphoric acid. While removal of the spacers 35 is preferred, it is optional. The lateral spacing between the source/drain silicide regions 48B and the central gate silicide region 48A is determined by the width of the silicon nitride spacer at the point where the region 48A contacts it. In the present embodiment, this spacing is between about 600 and 1,500 Angstroms. The MOSFET is now complete.

Figure 4K:
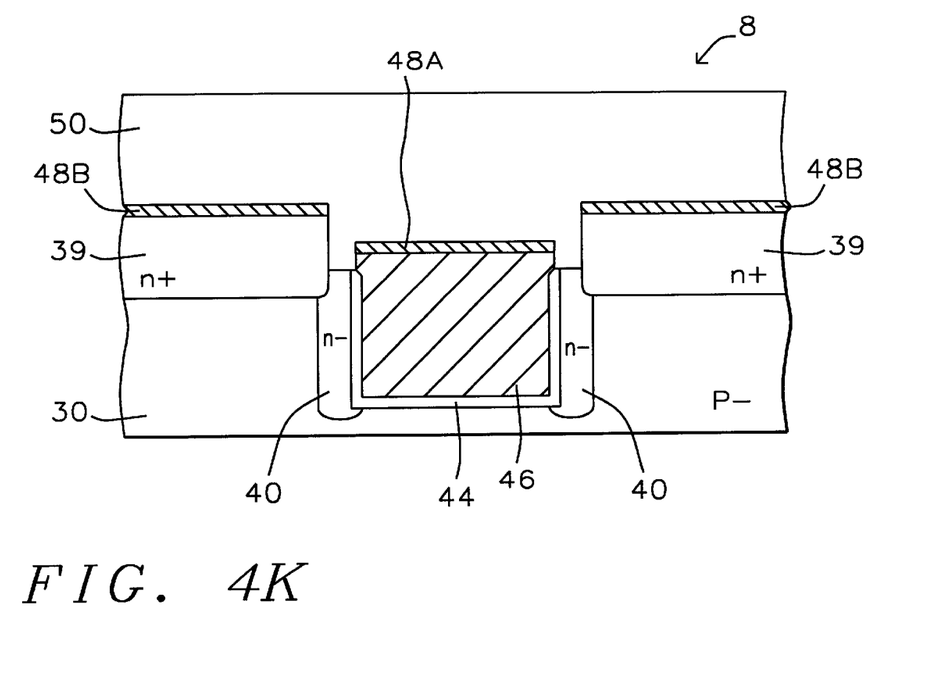
Figure 5:
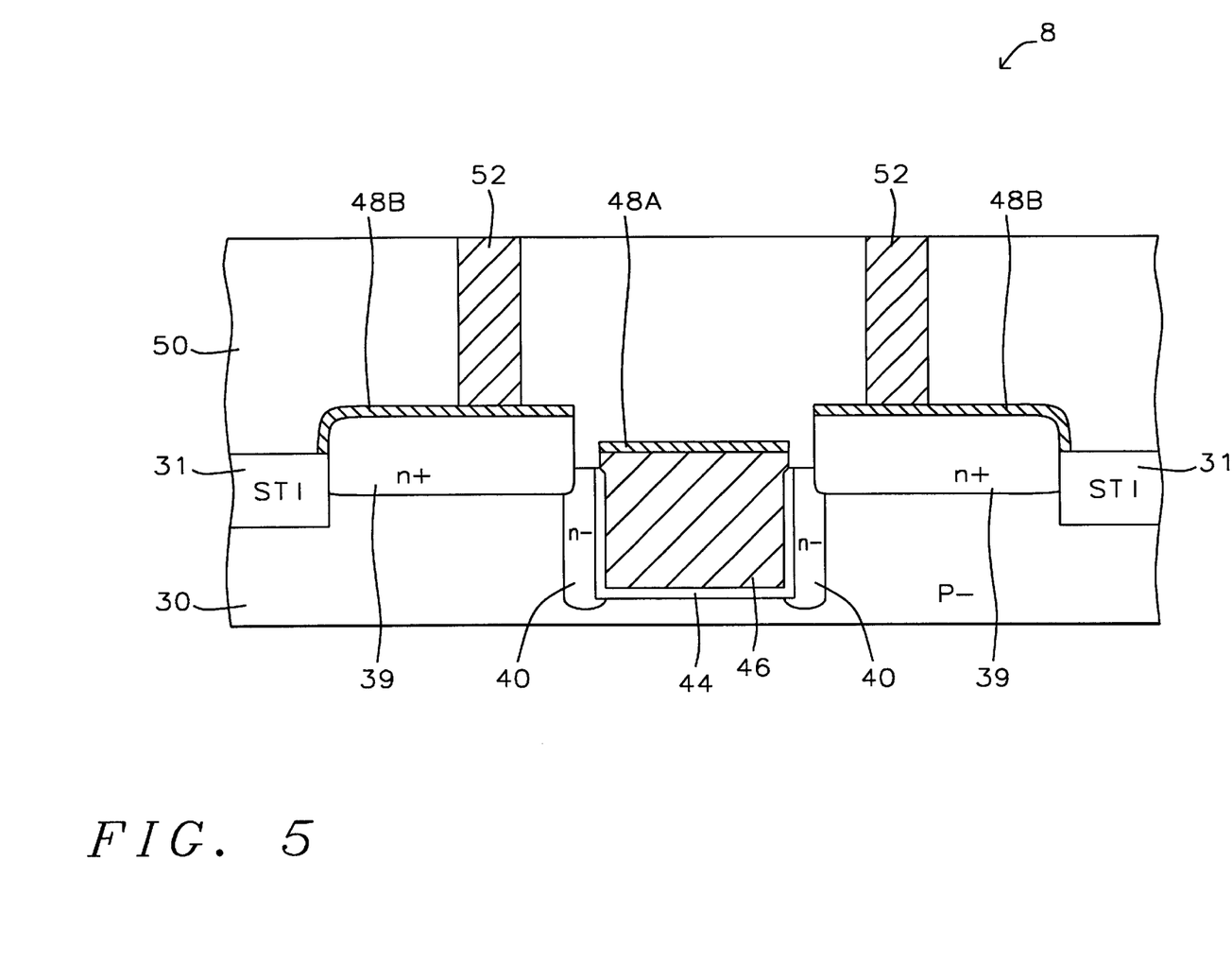
FIG. 5 is the cross sectional region showing a completed embedded polysilicon gate MOSFET formed in accordance with the procedures taught by a first embodiment of this invention.

Turning next to FIG. 4K, An ILD (interlevel dielectric) layer 50 is deposited over the wafer in the conventional way and planarized. Referring to FIG. 5 wherein the larger section of FIG. 3 is again shown, source/drain contacts 52 are formed in the ILD layer. Contact (not shown) to the polysilicon gate is made to a portion of the gate 46 which extends over field isolation at a point above or below the plane of the page.

In a second embodiment of this invention the epitaxial source/drain elements are replaced by ion implanted source/drain elements. The processing steps for this embodiment, except for the source/drain formation are essentially the same as those in the first embodiment. However, there are some notable differences which affect the details of the processing as well as in the final device.

A p-channel MOSFET with an embedded polysilicon gate and self-aligned LDD regions is formed. Referring first to FIG. 3, a p-type <100> oriented monocrystalline silicon wafer 30 with a resistivity of between about 2 and 50 ohm cm. is provided. A field isolation 31 preferably shallow trench isolation (STI) is formed defining an enclosed silicon region 8 wherein the device will be formed. The STI region 31 is formed by the well known method of anisotropically etching a trench surrounding the active silicon device region, growing a between about 100 and 500 Angstrom thick thermal oxide in the trench and then filling the trench by depositing an insulative layer, preferably silicon oxide. The excess silicon oxide above the trench is then removed by CMP (chemical mechanical polishing). Alternately the field isolation 31 may be formed by the familiar LOCOS (local oxidation of silicon) method. The field isolation is between about 0.2 and 0.4 microns thick. In order to more clearly delineate the structural features of the embedded gate MOSFET, the STI region will be omitted in the set of figures (FIGS. 6A through 6K) which illustrate the various process steps. As in the first embodiment, the STI regions 31 are omitted in FIGS. 6A through FIG. 6G.

Figure 6A:
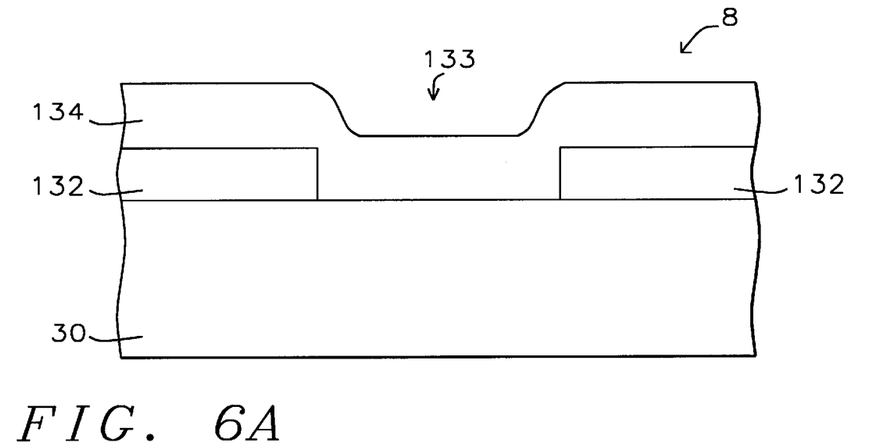
FIG. 6A through FIG. 6K are cross sections illustrating the process steps used in a second embodiment of this invention.
Figure 6B:
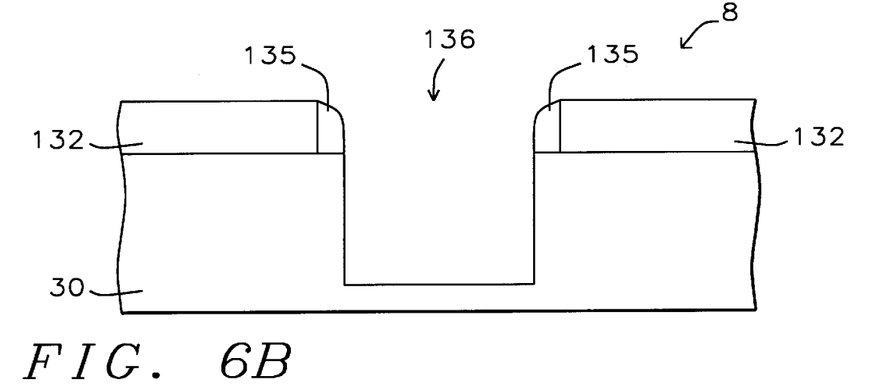

Referring to FIG. 6A, a silicon oxide layer 132, is deposited on the wafer 30 by a conventional conformal deposition process such as LPCVD. Alternately, a doped silicon oxide for example BPSG or PSG may be used to form the layer 132. However, unlike the first embodiment, a high etch rate relative to a subsequently deposited layer is acceptable but not necessary. The silicon oxide layer 132 is between about 0.2 and 0.3 microns thick. An opening 133 is patterned in the oxide layer by conventional photolithography, and a silicon nitride layer 134 is deposited over the oxide layer 132. The silicon nitride layer 134 is deposited by LPCVD or by PECVD to a thickness of between about 800 and 1,200 Angstroms. Referring next to FIG. 6B, the silicon nitride layer 134 is anisotropically etched to form silicon nitride sidewall spacers 135 along the periphery of the opening 133. The spacers 135 are between about 600 and 1,500 Angstroms wide at their base.

Using the silicon oxide layer 132 and the spacers 135 as a mask, a trench 136 is etched in the silicon to a depth of between about 0.1 and 0.3 microns. The trench 136 is anisotropically etched by RIE (reactive ion etching) using well known silicon etchant compositions containing, for example, chlorine or gas mixtures containing $HBr/SF_6/O_2$ or $HBr/Cl_2/O_2$. Silicon trench etching methods have been developed that trenches with smooth vertical walls and flat bottoms can be readily achieved.

Figure 6C:
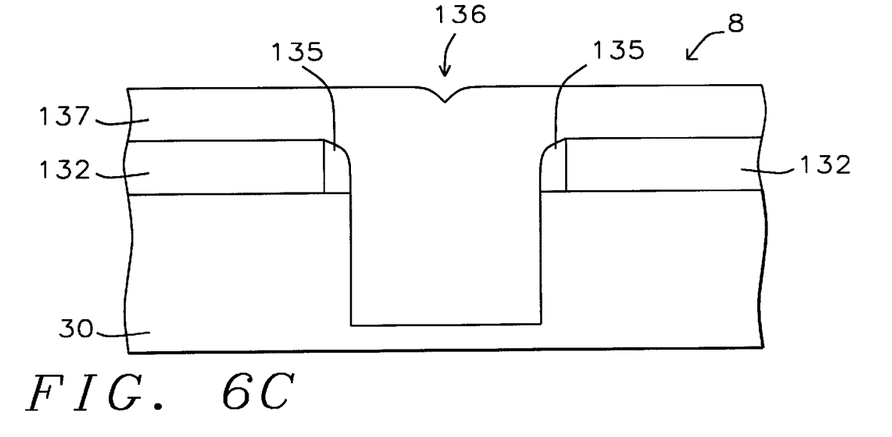
Figure 6D:
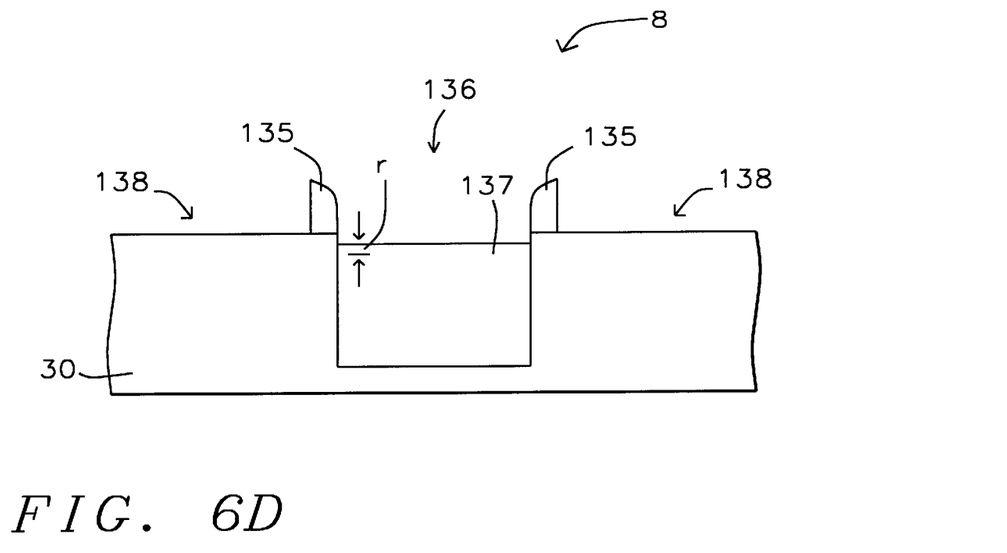

Turning now to FIG. 6C, a silicon oxide layer 137, between about 0.4 and 0.7 microns thick, is deposited onto the wafer 10 preferably by HDPECVD. This thickness is sufficient to completely fill the trench 136 and provide additional material above it. Alternately, other well known deposition method such as conventional LPCVD may be used to deposit the silicon oxide layer 137. The silicon oxide layer 137 combined with the silicon oxide layer 132 will be used as a sacrificial layer for masking in two successive process operations. Alternately, the silicon oxide layer 132 may be removed prior to the deposition of the oxide layer 137. An upper portion of the layer 137 is next polished away by CMP until the tops of the silicon nitride spacers 135 are just covered by oxide. This makes the surface of the layer 137 uniformly planar and parallel to the silicon surface.

The remaining portion of the oxide layer 137 and the silicon oxide layer 132 are next removed with a calibrated dilute aqueous HF etchant until the planar silicon surface is exposed. Calibrated dilute HF etchants are commonly used in the industry and are capable of removing oxide layers with a degree of precision. Because the layer 132 and the layer 137 are both silicon oxide, the wet etch will etch each at essentially the same rate. In order to assure thorough removal of oxide over the planar silicon regions, it is necessary to provide an over etch period. This will cause the surface of the oxide layer 137 over the trench to go below the planar silicon level and expose silicon along the upper corners of the trench walls. This is shown by the recess distance "r" in FIG. 6D where the profile after the oxide etch is shown. Unlike the first embodiment, exposure of the upper corners of the trench is not detrimental. The active silicon surface regions 138 extend between the spacers 135 and the STI regions 11(FIG. 3).

Figure 6E:
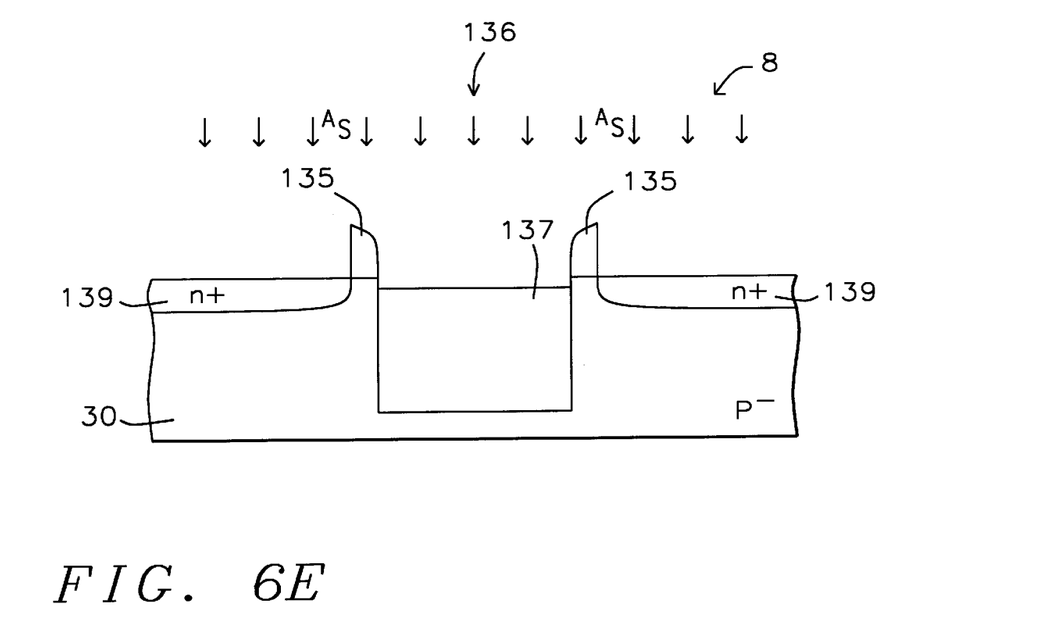

Referring next to FIG. 6E, arsenic ions are implanted into the active silicon regions 138. forming source/drain elements 139. A thermal anneal is then applied by RTA (rapid thermal annealing to activate the implanted arsenic ions. The resultant n+ source/drain regions 139 are between about 1,000 and 1,500 Angstroms.

Figure 6F:
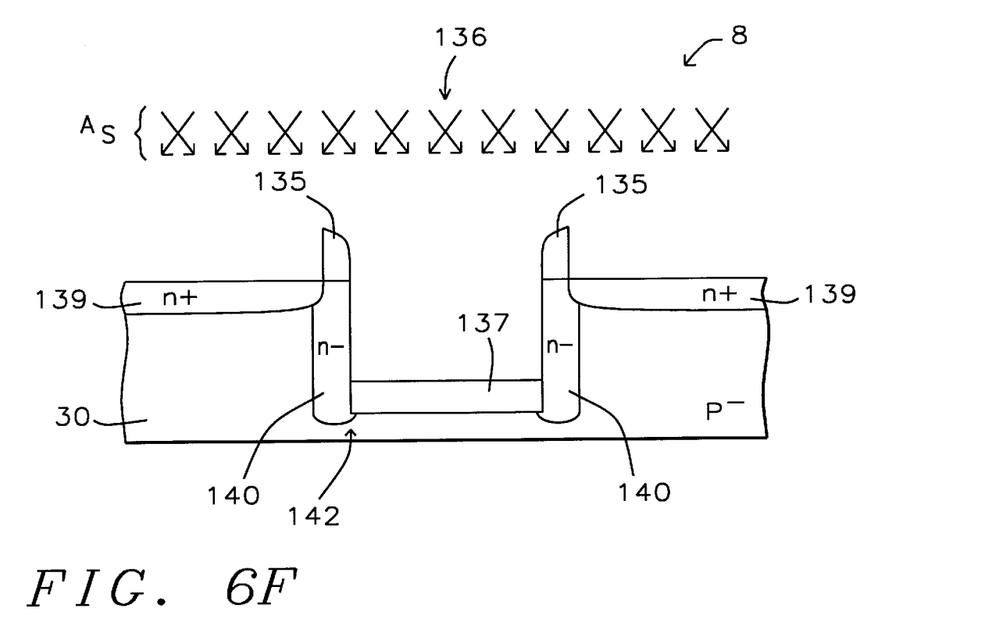

Referring now to FIG. 6F, the pocket of sacrificial silicon oxide layer 137 in the trench 136 is further etched to expose portions of the trench si-dewalls. The etching is preferably with a calibrated wet etch such as dilute HF or dilute buffered HF. However, between about 500 and 1,000 Angstroms of the oxide layer 137 is retained over the trench bottom. Arsenic ions are next implanted into the sidewalls of the trench 136. Alternately, another n-type dopant impurity such as phosphorous or antimony may be implanted.

The implantation is performed by LATI whereby the surface of the wafer is tilted at an angle of between about 40 and 50 degrees with respect to the ion beam. The wafer is first oriented so that one sidewall of the trench is implanted at the tilt angle. The wafer is then rotated 180 degrees and the opposite sidewall receives an implantation. The implanted sidewalls of the trench 136 thus become the LDD regions 140 of the MOSFET. The arsenic ions are implanted at a dose of between about $5 \times 10^{13}$ and $1 \times 10^{15}$ ions/cm$^2$ at an energy of between about 5 and 15 keV. The LDD regions 140 are self-aligned within the trench 136 and are contiguous with the more heavily doped source/drain regions 139 which have been extended below the level of the spacers 135 during the epitaxial process step. The final 500 to 1,000 Angstroms thick portion of the oxide layer 137 at the base of the trench masks the trench bottom during the LDD ion implant.

It should be noted that the LDD regions 140 extend below and under the bottom corners of the trench 142 so that the corner will not be included in the channel region. This reduces the channel length and places the channel away from stressed regions at the corners. The amount of under-pass of the LDD regions is determined by the thickness of the oxide layer 137 remaining on the bottom of the trench. The residual sacrificial silicon oxide 137 within the trench is next removed preferably by a timed wet etch dip in an etch rate calibrated dilute HF solution. Alternately, plasma etching could be used to remove the residual oxide 137. However, this exposes the gate oxide to the plasma. Care must be exercised to avoid thinning the silicon nitride spacers 135.

Figure 6G:
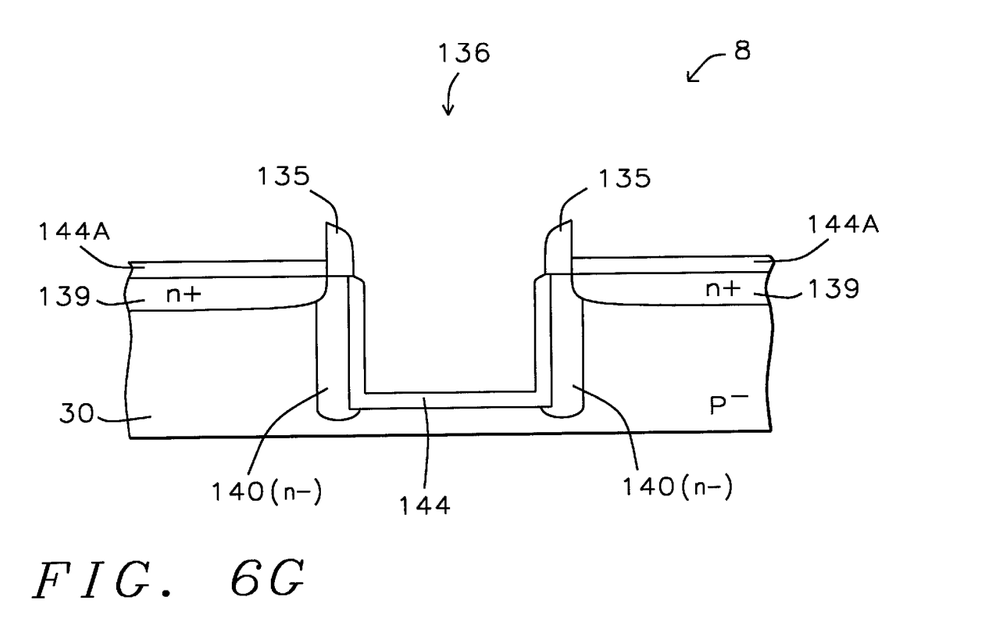
Figure 6H:
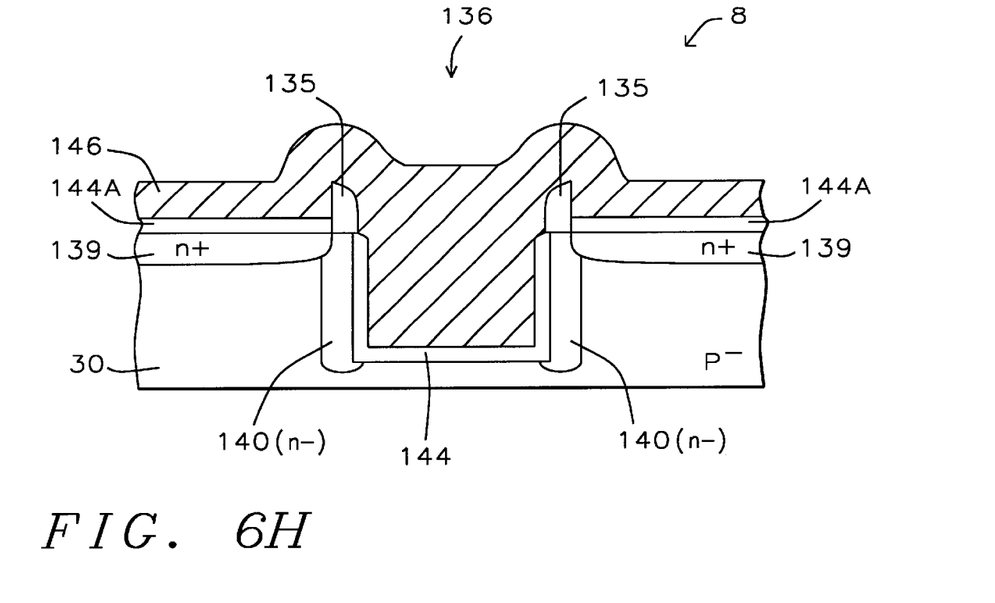

Referring to FIG. 6G a gate oxide is formed on the exposed silicon surface 144 within the trench 136, preferably by thermal oxidation. The gate oxide 144 is between about 30 and 200 Angstroms thick. An oxide 144A is also formed over the source/drain regions 139. Turning next to FIG. 6H, a polysilicon layer 146 is deposited over the wafer 30, filling the trench 136 to above the spacers 135. Preferably, the polysilicon layer 146 is deposited by LPCVD as a laminar structure comprising a portion of undoped polysilicon between about 1,000 and 2,000 Angstroms thick. An arsenic precursor is then added to the deposition gas flow and a second portion of the layer 146 is deposited to achieve a final polysilicon thickness of between about 9,000 and 10,000 Angstroms thick. Alternately the polysilicon layer 146 may be formed in another laminar configuration, or it may by formed from a single polysilicon deposition and subsequently ion implanted with dopant impurities to make it's upper portion more conductive.

Figure 6I:
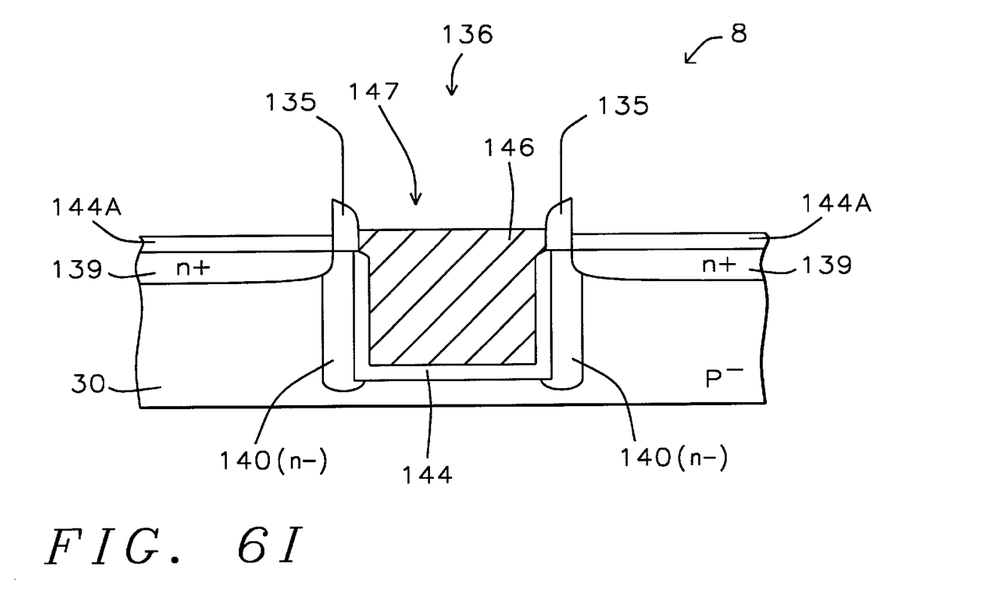

The polysilicon layer 146 is next planarized, preferably by CMP. The polysilicon 146 is then further etched to a depth in the trench 136 so that the polysilicon surface lies between about 1,000 and 2,000 Angstroms above the base of the sidewalls 135 as shown in FIG. 6I. The preferred method is by using a calibrated silicon etch, for example aqueous or alcoholic KOH heated to a temperature of between about 180 and 250° C. KOH based etchants provide good etch rate control and a high Si:SiO$_2$ selectivity. Alternately, an etchant containing TMAH (tetra methyl ammonium oxide) may be used. TMAH etchants are well known and attack silicon at rates of about 100 Å/sec. They have Si:SiO$_2$ selectivities of the order of 1,000:1. The oxide 144A and the sidewalls 135 act as an etch stop, protecting the structures beyond the trench 136. The residual portion 147 of the polysilicon layer 146 within the trench comprises the fully formed gate electrode of the MOSFET. The gate oxide 144 of the device is completely enclosed and will not be exposed to any plasma or chemical etchants. The oxide layer 144A is now removed from over the n-doped source/drain regions 139 by etching with dilute HF.

Figure 6J:
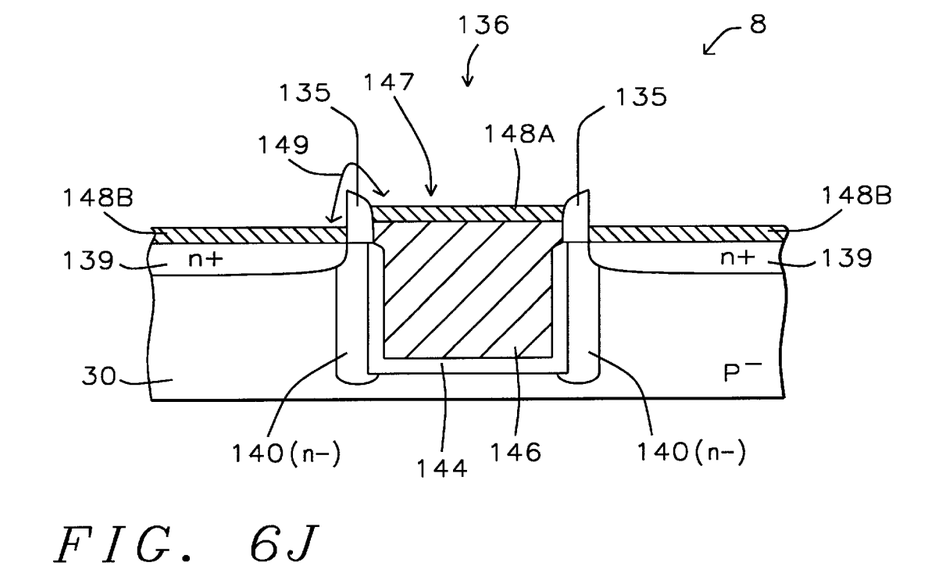

Referring to FIG. 6J, the surfaces of the source/drain regions 139 and the polysilicon gate electrode 147 are selectively silicided to make them more conductive and to prepare them for subsequent contact formation. Procedures for selective silicidation are well known and consist of depositing a blanket layer of a refractory metal for example titanium, cobalt, or nickel, and reacting the metal with the subjacent silicon to form a silicide. Un-reacted metal is then etched away by wet etching leaving a metal silicide 148A over the gate electrode 147 and 148B over the source/drain regions 139. The spacers 135 perform their final role in protecting the subjacent LDD regions 140 and sidewall portions of the gate from silicidation. The surface of the gate 146 is set deeply enough beneath the tops of the sidewalls 135 to maximize the linear distance 149 between the silicide 148A over the gate electrode and the silicide 148B over the source/drain elements 139. It will be apparent that, in the instance of the ion implanted device of this distance is generally greater in the ion implanted device described in this embodiment that the epitaxial device of the first embodiment. The greater linear distance 149 in the ion implanted device makes it less susceptible to gate-to-source drain shorts by silicide bridging than the epitaxial device.

The silicon nitride spacers 135 are removed, preferably by dipping the wafer 30 into a solution of hot phosphoric acid. While removal of the spacers 135 is preferred, it is optional. The lateral spacing between the source/drain silicide regions 148B and the central gate silicide region 148A is determined by the width of the silicon nitride spacer at the point where the region 148A contacts it. In the present embodiment, this spacing is between about 600 and 1,500 Angstroms. The MOSFET is now complete.

Figure 6K:
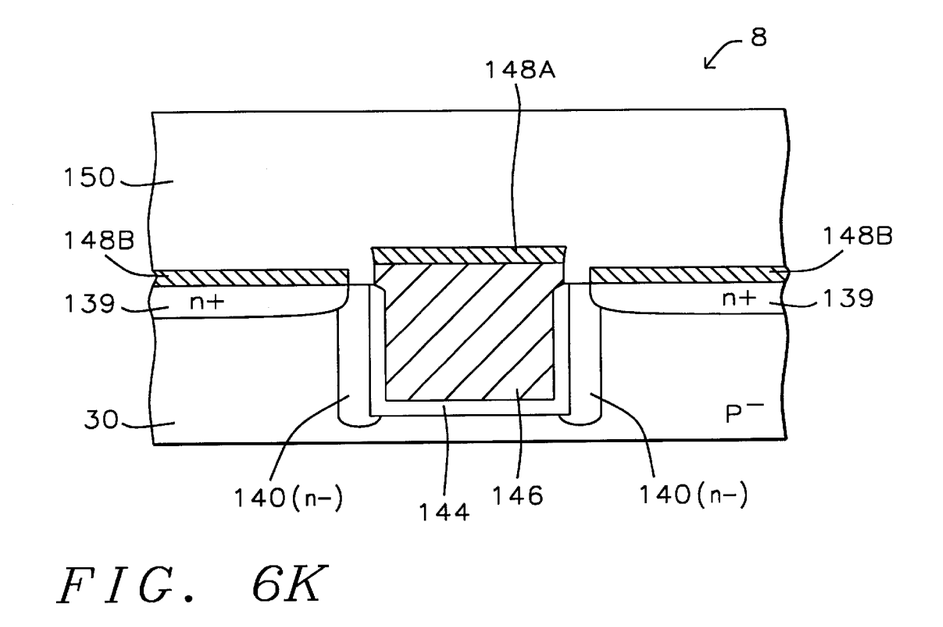
Figure 7:
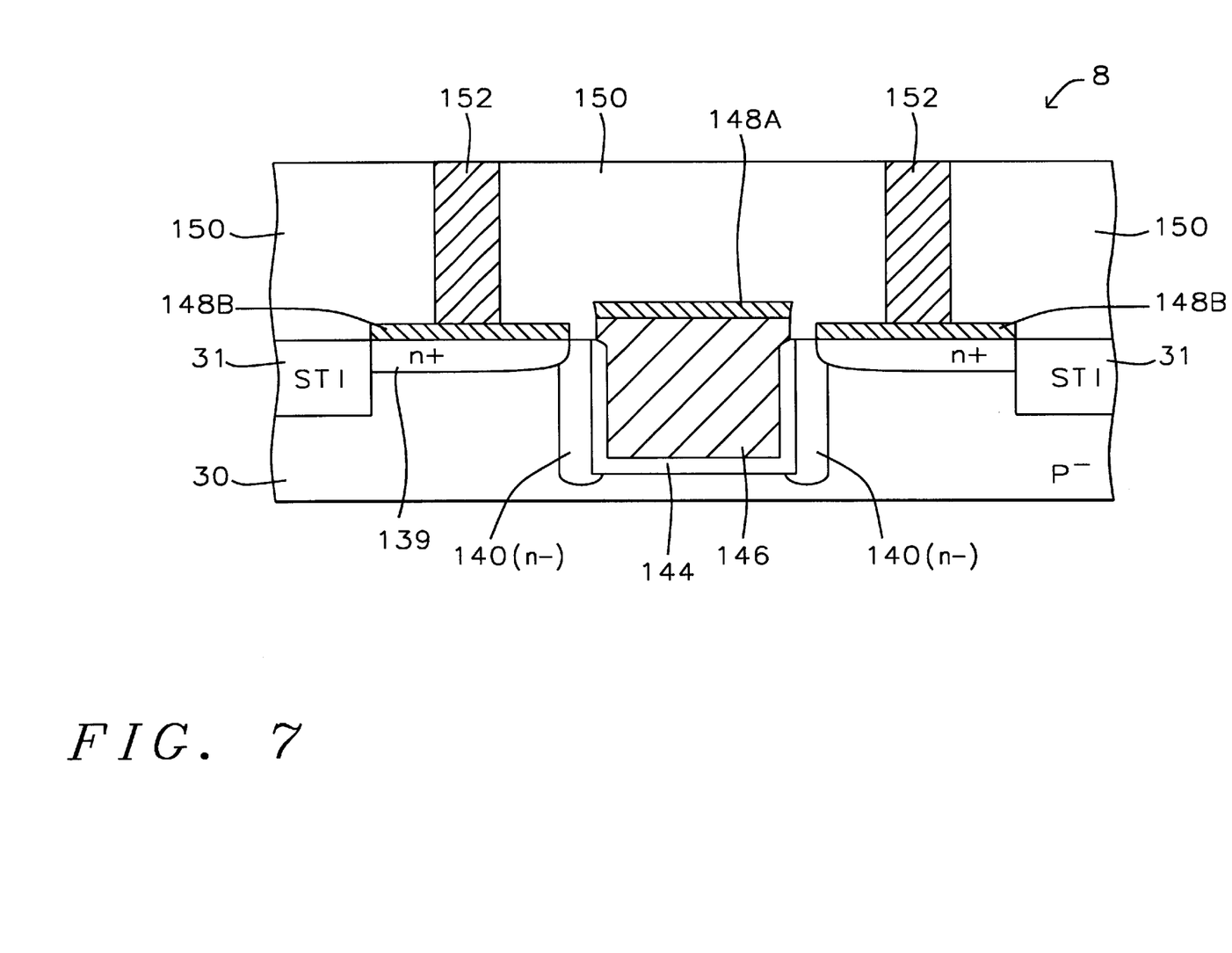
FIG. 7 is the cross sectional region showing a completed embedded polysilicon gate MOSFET formed in accordance with the procedures taught by a second embodiment of this invention.

Turning next to FIG. 6K, An ILD (interlevel dielectric) layer 150 is deposited over the wafer in the conventional way and planarized. Referring to FIG. 7 wherein the larger section of FIG. 3 is again shown, source/drain contacts 152 are formed in the ILD layer. Contact (not shown) to the polysilicon gate is made to a portion of the gate 146 which extends over field isolation at a point above or below the plane of the page.

While this invention has been particularly shown and described with reference to the preferred embodiments thereof, it &ill be understood by those skilled in the art that various changes in form and details may be made without departing from the spirit and scope of the invention.

While the embodiments of this invention utilize a p-type silicon substrate, an n-type silicon substrate could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated.

What is claimed is:

1. A method for forming and embedded polysilicon gate MOSFET comprising:

(a) providing a silicon wafer having an active region of a first conductivity type surrounded by a field isolation;

(b) depositing a doped oxide layer on said silicon wafer;

(c) forming an opening in said doped oxide layer, said opening bridging across said active region;

(d) forming silicon nitride spacers along the periphery of said opening;

(e) etching a trench in said opening;

(f) depositing a silicon oxide layer over said silicon wafer;

(g) planarizing said silicon oxide layer;

(h) etching said silicon oxide layer with a calibrated wet etch to expose the surface of said silicon wafer and said spacers while leaving a pocket of said silicon oxide layer in said trench, the surface of said pocket extending above the base of said spacers by a distance;

(i) selectively depositing an epitaxial silicon layer of a second conductivity type on said wafer, thereby forming source/drain regions;

(j) further etching said pocket to expose silicon along the sidewalls of said trench and leaving a residual portion of said pocket over the base of said trench;

(k) implanting ions of said second conductivity type into said sidewalls of said trench, thereby forming LDD regions;

(l) removing said residual portion;

(m) forming a gate oxide on the walls and base of said trench and a corresponding oxide layer on the surface of said source/drain regions;

(n) depositing a polysilicon layer over said wafer;

(o) planarizing said polysilicon layer;

(p) etching back said polysilicon layer, stopping in said corresponding oxide layer and leaving the level of the surface of said polysilicon in said trench between about 1,000 and 2,000 Angstroms above the base of said spacers, thereby forming an embedded gate electrode;

(q) removing said corresponding oxide layer, thereby exposing said source/drain regions; and (r) forming a metal silicide on said source/drain regions and said polysilicon layer.

2. The method of claim 1 wherein said doped oxide layer is between about 1,000 and 3,000 Angstroms thick.

3. The method of claim 1 wherein said doped oxide layer is selected from the group consisting of a borophosphosilicate glass, and a phosphosilicate glass.

4. The method of claim 1 wherein said opening is rectangular across said bridging and wherein the channel length of said MOSFET is the width of said opening on said bridging as measured perpendicular to the direction of said bridging reduced by the widths of said spacers at their base.

5. The method of claim 1 wherein said spacers are between about 600 and 1,500 Angstroms wide at their base.

6. The method of claim 4 wherein the width of said trench as measured in the direction perpendicular to said bridging is between about 0.2 and 40 microns.

7. The method of claim 1 wherein said epitaxial layer is between about 1,000 and 1,500 Angstroms thick.

8. The method of claim 1 wherein said gate oxide is between about 30 and 200 Angstroms thick.

9. The method of claim 1 wherein said LDD elements extend beneath and under the base of said trench.

10. The method of claim 1 wherein said metal silicide is selected from the group consisting of titanium silicide, cobalt silicide, and nickel silicide.

11. The method of claim 1 wherein said polysilicon layer is of laminar construction having a first undoped portion which is in contact with said gate oxide and a second portion doped with an impurity.

12. The method of claim 1 wherein said distance is between about 100 and 400 Angstroms.

13. An embedded polysilicon gate MOSFET comprising:
(a) A silicon body of a first conductivity type with an active region bounded by a field isolation;
(b) a rectangular trench bridging across said active region, dividing said active region into two active surfaces, one on each side of said bridging;
(c) first regions of a second conductivity type comprising source/drain elements of said MOSFET, formed in said active surfaces and spaced laterally away from the mouth of said trench by a distance;
(d) second regions of said second conductivity type, formed on the sidewalls of said trench, contiguous with said first regions and extending vertically below the base of said trench, said second regions having a higher resistivity than said first regions and comprising LDD elements of said MOSFET;
(e) a gate oxide on the sidewalls and bottom of said trench; and
(f) a polysilicon body in said trench on said gate oxide comprising a gate electrode.

14. The MOSFET of claim 13 wherein said gate oxide is between about 30 and 200 Angstroms thick.

15. The MOSFET of claim 13 wherein said trench is between about 1,000 and 3,000 Angstroms deep.

16. The MOSFET claim 13 wherein said distance is between about 600 and 1,500 Angstroms.

17. The MOSFET of claim 13 wherein said polysilicon body is of laminar construction having a first undoped portion which is in contact with said gate oxide and a second portion doped with an impurity.

18. The method of claim 13 wherein said LDD elements extend beneath and under the base of said trench.

19. A method for forming and embedded polysilicon gate MOSFET comprising:
(a) providing a silicon wafer having an active region of a first conductivity type surrounded by a field isolation;
(b) depositing an oxide layer on said silicon wafer;
(c) forming an opening in said oxide layer, said opening bridging across said active region;
(d) forming silicon nitride spacers along the periphery of said opening;
(e) etching a trench in said opening;
(f) depositing a silicon oxide layer over said silicon wafer;
(g) anisotropically etching said silicon oxide layer to expose the surface of said silicon wafer and said spacers while leaving a pocket of said silicon oxide layer in said trench, said pocket extending upward to at least the base of said spacers;
(h) implanting ions of a second conductivity type into said wafer, thereby forming source/drain regions;
(i) further etching said pocket to expose silicon along the sidewalls of said trench and leaving a residual portion of said pocket over the base of said trench;
(j) implanting ions of said second conductivity type into said sidewalls of said trench, thereby forming LDD regions; (k) removing said residual portion;
(l) forming a gate oxide on the walls and base of said trench and a corresponding oxide layer on the surface of said source/drain regions;
(m) depositing a polysilicon layer over said wafer;
(n) planarizing said polysilicon layer
(o) etching said polysilicon layer, stopping in said corresponding oxide layer and leaving the level of the surface of said polysilicon in said trench between about 1,000 and 2,000 Angstroms above the base of said spacers, thereby forming an embedded gate electrode;
(p) removing said corresponding oxide layer, thereby exposing said source/drain regions; and
(q) forming a metal silicide on said source/drain regions and on said polysilicon layer.

20. The method of claim 19 wherein said oxide layer is between about 1,000 and 3,000 Angstroms thick.

21. The method of claim 19 wherein said oxide layer is selected from the group consisting of silicon oxide, a borophosphosilicate glass, and a phosphosilicate glass.

22. The method of claim 19 wherein said opening is rectangular across said bridging and wherein the channel length of said MOSFET is the width of said opening on said bridging as measured perpendicular to the direction of said bridging reduced by the widths of said spacers at their base.

23. The method of claim 19 wherein said spacers are between about 600 and 1,500 Angstroms wide at their base.

24. The method of claim 22 wherein the width of said trench as measured in the direction perpendicular to said bridging is between about 0.2 and 40 microns.

25. The method of claim 19 wherein said gate oxide is between about 30 and 200 Angstroms thick.

26. The method of claim 19 wherein said LDD elements extend beneath and under the base of said trench.

27. The method of claim 19 wherein said metal silicide is selected from the group consisting of titanium silicide, cobalt sulicide, and nickel silicide.

28. The method of claim 19 wherein said polysilicon layer is of laminar construction having a first undoped portion which is in contact with said gate oxide and a second portion doped with an impurity.

* * * * *